United States Patent
Richardson et al.

[11] Patent Number: 6,060,837
[45] Date of Patent: May 9, 2000

[54] METHOD OF AND APPARATUS FOR MINIMIZING PLASMA INSTABILITY IN AN RF PROCESSOR

[75] Inventors: Brett C. Richardson, San Ramon; Tuan Ngo, Milpitas, both of Calif.

[73] Assignee: Lam Research Corporation, Fremont, Calif.

[21] Appl. No.: 09/335,493

[22] Filed: Jun. 18, 1999

Related U.S. Application Data

[62] Division of application No. 09/005,146, Jan. 9, 1998, Pat. No. 5,929,717.

[51] Int. Cl.$^7$ .................................................. H05H 1/46
[52] U.S. Cl. ............................ 315/111.51; 324/76.45; 324/76.46
[58] Field of Search .................... 315/111.21, 111.31, 315/111.51; 324/76.41, 76.44, 76.45, 76.46

[56] References Cited

U.S. PATENT DOCUMENTS

| | | |
|---|---|---|
| 5,474,648 | 12/1995 | Patrick et al. ........................ 156/627.1 |
| 5,689,215 | 11/1997 | Richardson et al. .................... 333/17.3 |
| 5,793,162 | 8/1998 | Barnes et al. ....................... 315/111.21 |
| 5,815,047 | 9/1998 | Sorensen et al. ....................... 333/17.3 |
| 5,842,154 | 11/1998 | Harnett .................................... 702/106 |

*Primary Examiner*—Justin P. Bettendorf
*Attorney, Agent, or Firm*—Lowe, Hauptman, Gopstein, Gilman & Berner, LLP

[57] ABSTRACT

Variable reactances of a matching network connected between an r.f. source and a plasma load of a vacuum plasma chamber processing a workpiece are varied so a tendency of the plasma to change in an unstable manner which can adversely affect processing of the workpiece is avoided while matching is approached. The plasma tendency to change in an unstable manner is detected by monitoring an electrical parameter resulting from r.f. current flowing between the source and load via the network. The parameter can be (1) statistically based, e.g. variance of percent delivered power, or (2) amplitude modulation in one or both of the 2–20 kHz and 50–200 kHz ranges.

25 Claims, 6 Drawing Sheets

METHOD OF AND APPARATUS FOR MINIMIZING PLASMA INSTABILITY IN AN RF PROCESSOR

This application is a Divisional of application Ser. No. 09/005,146 filed Jan. 9, 1998 now U.S. Pat. No. 5,929,717.

FIELD OF INVENTION

The present invention relates generally to a vacuum plasma processor apparatus and method and more particularly to such a method and apparatus wherein an impedance matching network connected between an r.f. source and a load including the plasma is controlled to minimize unstable changes in the plasma while an impedance match is approached between the r.f. source and its load.

BACKGROUND ART

Vacuum plasma processors deposit materials on and etch materials from workpieces that are typically semiconductor, dielectric and metal substrates. A gas is introduced into a vacuum plasma processing chamber where the workpiece is located. The gas is ignited into a plasma in response to an r.f. electric or electromagnetic field. The r.f. field is provided by a reactive impedance element, usually either an electrode array or a coil which couples both magnetic and electrostatic r.f. fields to the gas. The reactive impedance element is connected to an r.f. source having a frequency and sufficient power such that the gas is ignited into an r.f. plasma. Connections between the source and the reactive impedance element are usually by way of a relatively long coaxial cable, connected directly to the r.f. source and a matching network. The matching network includes a pair of variable reactances, adjusted to (1) control tuning of the reactive impedance element and its load, including the r.f. plasma, relative to the source frequency and (2) match the impedance of the source to the load it is driving. When a match is reached the impedance seen looking into the r.f. source output terminals is about the same as the impedance seen by the r.f. source looking into the cable.

The load seen by the source is subject to substantial variations. The load is a relatively high impedance prior to ignition of the gas into the r.f. plasma state. In response to the plasma being ignited, the load impedance drops substantially due to the presence of the charge carriers, i.e., electrons and ions, in the excited plasma. The ignited plasma impedance also changes substantially due to variations in the plasma flux, i.e. the product of the plasma density and the plasma charge particle velocity. Hence, matching the source to the load to provide efficient transfer of power from the source to the load is somewhat difficult.

As the two matching network reactances are simultaneously varied along a trajectory to achieve matching, the plasma sometimes becomes unstable and the flux thereof varies in amplitude unpredictably. We have discovered that when the plasma is unstable the r.f. current changes in amplitude in a manner similar to the way the r.f. current of a radio transmitter changes during audio modulation. The r.f. is modulated in first and second frequency bands, respectively of 2 kHz–20 kHz and 50 kHz–200 kHz. Accordingly an unstable plasma is occasionally referred to herein as a modulated plasma. The instability varies the plasma flux so there is undesirable plasma activity on the workpiece. The plasma can become so unstable that it flickers on and off.

It is, accordingly, an object of the present invention to provide a new and improved method of and apparatus for controlling a plasma of a vacuum plasma processor to enable uniform, predictable workpiece characteristics to be attained.

Another object of the invention is to provide a method of and apparatus for controlling reactances of a matching network connected between an r.f. source and a vacuum plasma processor in such a way that instability of the plasma, also known as plasma modulation, is, to a large extent, avoided while achieving matching.

Another object of the invention is to provide a new and improved method of and apparatus for detecting plasma instability in a vacuum plasma processor.

THE INVENTION

In accordance with one aspect of the present invention, a matching network connected between an r.f. source and a plasma processor load is controlled so a tendency for the plasma to change in an unstable manner which adversely affects processing of a workpiece is minimized and the match is substantially achieved. Preferably, a controller for the values of first and second variable reactances of the matching network responds to a function of an electric parameter that results from r.f. current flowing between the source and load to detect whether or not the plasma is tending to change in the unstable manner. After the tendency for instability is detected, the instability is substantially avoided and match is approached by changing the first and second reactances in a manner different from how they were changed prior to detection of instability. Prior to instability detection the values of both reactances are simultaneously changed along a straight line trajectory between a starting point for the two reactances and a final value for the two reactances; matching would occur approximately at the final value if the trajectory were followed. When the onset of instability is detected the trajectory is altered and the instability is avoided by varying the two reactances.

According to a further aspect of the invention, an unstable condition of an r.f. plasma of an r.f. plasma processor is detected by signalling that a function determined by the spread values of an electrical parameter resulting from an r.f. field being supplied to the plasma exceeds an amplitude associated with the unstable condition. In the preferred embodiment the function is variance.

In accordance with a further aspect of the invention, an unstable condition of an r.f. plasma of a plasma processor is detected by determining the amplitude of an electrical parameter resulting from r.f. current flowing between an r.f. source and a plasma load. The value of a function indicating the spread of values of the electrical parameter is detected. In response to the value of the function exceeding or not exceeding an amplitude associated with the unstable condition, the presence and absence of stability are respectively determined.

An additional aspect of the invention is concerned with detecting an unstable condition of a plasma of a plasma processor, wherein the plasma is derived by supplying r.f. energy to a reactive impedance element energizing a gas in the processor. The amplitude of an electrical parameter resulting from r.f. current being supplied to the reactive impedance is detected. The electrical parameter has a carrier frequency determined by the r.f. frequency of the field. We discovered that when instability occurs the r.f. carrier is amplitude modulated in at least one frequency band. The presence of the amplitude modulation in at least one of the frequency bands is detected and compared with a reference voltage.

An added aspect of the invention is concerned with a memory for use with a computer in combination with an apparatus for supplying r.f. energy to a plasma in a vacuum plasma chamber for processing a workpiece. The apparatus is such that a gas in the chamber is coupled with a reactive impedance element for coupling an r.f. field to the gas. The r.f. field is such that it can excite the gas to the plasma. The reactive impedance element is connected via a matching network to an r.f. source that can generate the r.f. field. The matching network has variable impedance properties and is coupled to a load including the reactive impedance element and the plasma. The plasma has a tendency to change in an unstable manner which can adversely affect processing of the workpiece. The apparatus derives signals indicative of values of electrical parameters resulting from current flowing between the source and the load via the network. The memory comprises a medium that stores signals for controlling the computer so the computer can (a) derive signals indicative of the plasma being in the unstable state in response to the signals indicative of the values of the electrical parameters, and (b) in response to the plasma being indicated as being at the onset of the unstable state control the value of the variable impedance properties of the matching network so the plasma unstable tendency is substantially avoided and the plasma is maintained in a stable state while an impedance match is approached between the source and the impedance seen looking from the output terminals of the source.

The above and still further objects, features and advantages of the present invention will become apparent upon consideration of the following detailed description of several specific embodiments thereof, especially when taken in conjunction with the accompanying drawings.

DETAILED DESCRIPTION OF THE DRAWING

Figure 1:
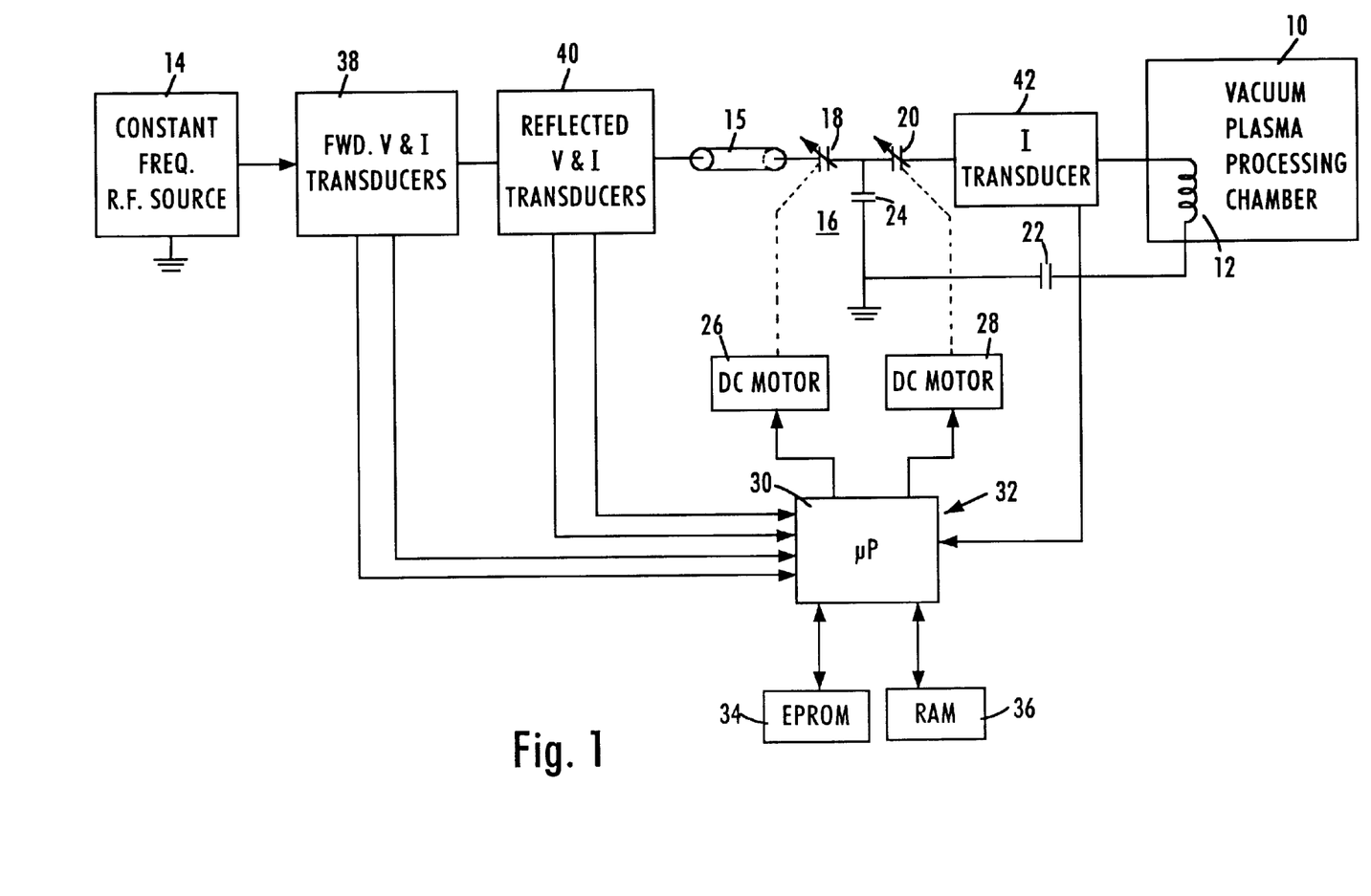
FIG. 1 is a block-circuit diagram of a preferred embodiment of the invention.

As illustrated in FIG. 1 of the drawing, conventional vacuum plasma processing chamber 10 includes excitation coil 12, connected to constant frequency (typically 13.56 MHz) r.f. source 14 by way of matching network 16. Coil 12 is a reactive impedance element for deriving an r.f. electromagnetic field that is coupled from outside of chamber 10 through a dielectric window (not shown) of the chamber to the chamber interior. Vacuum plasma processing chamber 10 is supplied with a gas from a suitable source (not shown). The gas is excited to and maintained in a plasma state (i.e., as a plasma discharge) by the r.f. electromagnetic field derived from coil 12. A workpiece (not shown), typically a glass, semiconductor or metal substrate, located in chamber 10 is processed by charge particles, i.e. electrons and ions, and neutral particles in the plasma so the workpiece is etched and/or material is deposited thereon. The plasma discharge and coil 12 form a load for source 14 and resonant matching network 16. Source 14 is connected to network 16 by cable 15, usually having a relatively long length, e.g. 13 feet. Cable 15 has a characteristic impedance at the frequency of source 14 equal to the output impedance of the source.

The plasma discharge in chamber 10 is subject to transient and nonlinear variations, which are reflected by matching network 16 and cable 15 to output terminals of r.f. source 14. Impedances of matching network 16 are controlled to minimize the power reflected back to the output terminals of source 14 despite these variations. As the impedances of network 16 are changed the plasma can become unstable, i.e. the plasma flux varies unpredictably to such an extent that the workpiece is improperly processed.

We have discovered that instability is accompanied by amplitude modulation of the r.f. current flowing from source 14 to coil 12. The amplitude modulation is in the frequency range from 2–20 Khz and/or 50–200 kHz. We have also discovered that plasma instability is also accompanied by a substantial increase in the statistical function variance (standard deviation squared) of electrical parameters resulting from r.f. current flowing from source 14 to coil 12. (Variance is a measure of the spread of values of a parameter.) The plasma can become so unstable that it flickers on and off.

An important aspect of the present invention is that the impedances of network 16 are controlled so (1) an impedance match occurs and (2) while the network impedances are being varied to achieve the match, the plasma does not become so unstable as to have an adverse effect on the workpiece being processed in chamber 10.

In a preferred embodiment. matching network 16 is configured as a "T," having two series arms, respectively including variable reactances in the form of series capacitors 18 and 20. The arm including capacitor 20 is in series with coil 12, in turn connected in series with fixed grounded capacitor 22. Matching network 16 also includes fixed shunt capacitor 24, connected between a common terminal for capacitors 18 and 20 and ground. Capacitor 18 primarily controls the magnitude of the resistive impedance component seen looking from the output terminals of source 14 into cable 15, while capacitor 20 primarily controls the magnitude of the reactive impedance seen looking from the output terminals of source 14 into cable 15. Frequently, capacitors 18 and 20 are respectively referred to in the art as the load and tune capacitors.

The values of capacitors 18 and 20 are usually varied so the output impedance of source 14, i.e. the impedance seen looking into the output terminals of source 14, usually 50 ohms resistive and zero ohms reactive ((50+j0)ohms), is matched to the impedance seen looking from the output terminals of the source into the input terminals of cable 15. The values of capacitors 18 and 20 are respectively varied by DC motors 26 and 28, supplied with DC control voltages by a digital to analog converter included in microprocessor 30 of microcomputer 32. Microcomputer 32 also includes EPROM 34 and RAM 36, respectively storing control program signals for microprocessor 30 and data signals that are manipulated by the microprocessor to control motors 26 and 28.

Microprocessor 30 includes an analog to digital converter responsive to signals from conventional forward voltage and current transducers 38, reflected voltage and current transducers 40, and current transducer 42 that monitors the r.f. current flowing from matching network 16 to coil 12. Transducers 38 derive analog signals that are replicas of the r.f. voltage and current supplied by source 14 to cable 15. Transducers 40 derive analog signals that are replicas of the r.f. voltage and current reflected from cable 15 back to source 14. Each of transducers 38 and 40 includes a directional coupler, a current transformer for deriving the current replica and a capacitive voltage divider for deriving the voltage replica. Current transducer 42 includes a current transformer for deriving a signal that is a replica of the r.f. current flowing through coil 12. While transducer 42 is shown as being in a line between matching network 16 and coil 12, the current transducer could be connected in a line from coil 12 to ground.

Microprocessor 30 responds to the analog signals derived from transducers 38, 40 and 42 to derive digital signals indicative of (1) the magnitude and relative phase angle of the r.f. voltages and currents supplied by source 14 to cable 15 and reflected from the cable to the source and (2) the r.f. current magnitude flowing from network 16 to coil 12. These digital signals are stored in RAM 36 and are manipulated by microprocessor 30 under the control of program signals stored in EPROM 34 to derive further signals that are used to produce control signals for motors 26 and 28.

Motors 26 and 28 vary the values of capacitors 18 and 20 in response to signals derived by microprocessor 30 to supply sufficient power to coil 12 to ignite the gas in chamber 10 to a plasma and to maintain the plasma in a stable condition. The values of capacitors 18 and 20 are usually varied in a direction to maximize a function of power coupled from source 14 to coil 12.

However, to maintain the plasma stable, microprocessor 30 also from time to time changes the values of capacitors 18 and 20 in directions such that power is not instantaneously increased toward its maximum value. The function of power can be any of: (1) the ratio of delivered r.f. power to forward r.f. power, (2) percent delivered r.f. power, or (3) r.f. current supplied by matching network 16 to coil 12. The same result is obtained by microprocessor 30 calculating and minimizing power reflected from the load to source 14. When these functions are maximized or minimized, as appropriate, there is a substantial impedance match, at the frequency of source 14, between the source and the load it is driving, i.e., the impedance, at the source frequency, seen looking into the output terminals of source 14 is approximately equal to the impedance seen looking from the source into cable 15.

Microprocessor 30 determines forward r.f. power, i.e., the r.f. power supplied by source 14 to cable 15, and delivered power, i.e., the power actually supplied to coil 12 by matching network 16, in response to the output signals of transducers 38 and 40. To this end, microprocessor 30 determines r.f. forward power by multiplying signals representing the r.f. voltage and current outputs of transducer 38 in accordance with $$P_f = V_o I_o \cos \theta_o$$

where:
$V_o$ is the magnitude of the r.f. output voltage of source 14,
$I_o$ is the magnitude of the r.f. output current of source 14, and
$\theta_o$ is the phase angle between the voltage and current derived from source 14.

To determine delivered r.f. power, microprocessor 30 determines reflected r.f. power. Microprocessor 30 determines reflected r.f. power in response to the r.f. voltage and current outputs of transducer 40 in accordance with $$P_r = V_r I_r \cos \theta_r$$

where:
$V_r$ is the magnitude of the r.f. voltage reflected from cable 15 to source 14,
$I_r$ is the magnitude of the r.f. current reflected from cable 15 toward source 14, and
$\theta_r$ is the phase angle between the reflected voltage and current.

Microprocessor 30 determines delivered r.f. power ($P_d$) as ($P_f - P_r$). Percent delivered r.f. power ($\%P_d$) is similar to the ratio of r.f. delivered power to r.f. forward power but is calculated by microprocessor 30 as $$\frac{P_f - P_r}{P_f} \times 100.$$

When there is a match, there is no r.f. reflected power, so (a) $P_d = P_f$, (b) the ratio of delivered r.f. power to forward power $$\left(\frac{P_d}{P_f}\right)$$

is 1, and (c) $\%P_d = 100$. Microprocessor 30 determines the r.f. current ($I_c$) supplied by matching network 16 to coil 12 exclusively in response to the output signal of current transducer 42.

In normal operation, when the plasma is stable and is not modulated, the values of load capacitor 18 and tune capacitor 20 are simultaneously varied by amounts to invariably obtain a very close impedance match between the output terminals of source 14 and the load it is driving. The relative amounts that the values of capacitors 18 and 20 are varied are determined so matching is invariably approached from the correct direction. The extent of the impedance match is preferably indicated by monitoring percent delivered power supplied by source 14 to the load it is driving. When percent delivered power is maximized, reflected power is minimized. It is to be understood, however, that other parameters relating the impedance match of source 14 and the load it is driving can be employed; other exemplary preferred parameters that can be maximized to indicate impedance match are ratio of delivered power to forward power and current supplied to coil 12.

In addition, the degree of impedance match can be determined by microprocessor 30 (1) comparing the phase angle between the voltage and current supplied by source 14 to cable 15 and (2) comparing the real impedance seen by source 14 looking into cable 15 and the known real impedance seen looking into the output terminals of source 14. In a matched condition, microprocessor 30 determines that the phase angle is zero and the real impedances are equal. However, it is more difficult to rely on comparisons (1) and (2) than on the other functions because the results of the comparisons must be combined.

Figure 2:
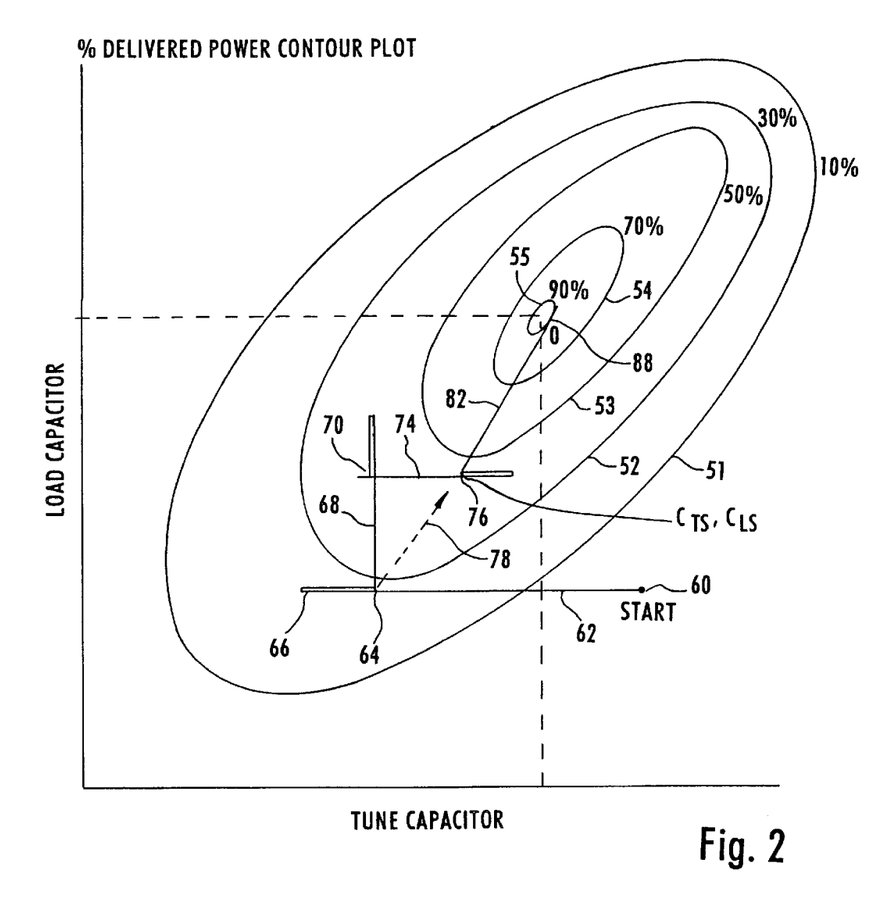
FIGS. 2 and 3 are plots useful in describing certain properties of the apparatus illustrated in FIG. 1.

FIG. 2 is helpful in describing how microprocessor 30 preferably varies the values of capacitors 18 and 20 to achieve an impedance match between source 14 and the load including the plasma and coil 12, when the plasma is stable. FIG. 2 is a plot of the values of tune capacitor 20 (along the X axis direction) and the values of load capacitor 18 (along the Y axis direction) for multiple percent delivered power contours 51–55. Each of contours 51–55 has a somewhat elliptical shape with contours 51, 52, 53, 54 and 55 respectively representing contours for 10%, 30%, 50%, 70%, and 90% delivered power. For all values of capacitors 18 and 20 outside 10% contour 51, the percent delivered power is less than 10% and for all values of capacitors 18 and 20 inside 95% contour 59 the value of the percent delivered power exceeds 95%. While only five contours are illustrated in FIG. 2 there is actually an infinite number of such contours that are a function of the values of capacitors 18 and 20. The contours are somewhat dynamic, depending on parameters of the plasma in processor 10.

Initially, microprocessor 30 determines the relative rates of change of capacitors 18 and 20 to calculate a trajectory through the contours of FIG. 2; in the example of FIG. 2, the initial trajectory is indicated by straight line 78. As the first step of this determination, microprocessor 30 changes the value of tune capacitor 20 while the value of load capacitor 18 is maintained constant until the microprocessor detects a "local" maximum percent delivered power value; in FIG. 2, this involves changing the value of tune capacitor 18 along horizontal line 62 from starting point 60 and to local maximum percent delivered power point 64. Then, during the second step of this determination, microprocessor 30 changes the value of load capacitor 18 while the value of tune capacitor 20 is maintained constant until the microprocessor detects another local maximum percent delivered power value; this operation is indicated in FIG. 2 by vertical line 68 between points 64 and 70. Then, during the third step, microprocessor 30 changes the value of tune capacitor 20 while the value of load capacitor 18 is maintained constant until the microprocessor detects another local maximum percent delivered power value; see horizontal line 74 between points 70 and 76.

From the values of capacitors 18 and 20 at the ends of the first and third steps, microprocessor 30 determines the slope of a first straight line trajectory 82 on FIG. 2 which will result in approximately maximizing percent delivered power. The slope of the first line indicates the amount by which microprocessor 30 must change one of capacitors 18 or 20 for each unit change in the value of the other capacitor. The values of capacitors 18 and 20 are then simultaneously varied by microprocessor 30 along the first trajectory 82 until microprocessor 30 again detects maximum percent delivered power at point 86 at the end of trajectory 82. Typically, at the end of the first trajectory, maximum percent delivered power has a value in excess of 90%.

To maximize percent delivered power, if maximum percent delivered power along the first straight line trajectory is detected as being less than a predetermined target value, such as 96%, microprocessor 30 determines another trajectory, which usually results in the values of capacitors 18 and 20 being changed simultaneously so percent delivered power is at least 96%.

Details of the specific steps performed by microprocessor 30 to achieve these results for normal, stable operation are described in the commonly assigned U.S. patent of Brett Richardson, Tuan Ngo and Michael S. Barnes, entitled METHOD OF AND APPARATUS FOR CONTROLLING REACTIVE IMPEDANCES OF A MATCHING NETWORK CONNECTED BETWEEN AN RF SOURCE AND AN RF PLASMA PROCESSOR, filed May 23, 1996, Ser. No. 08/652,037, issued Nov. 18, 1997 as U.S. Pat. No. 5,689,215.

Figure 3:
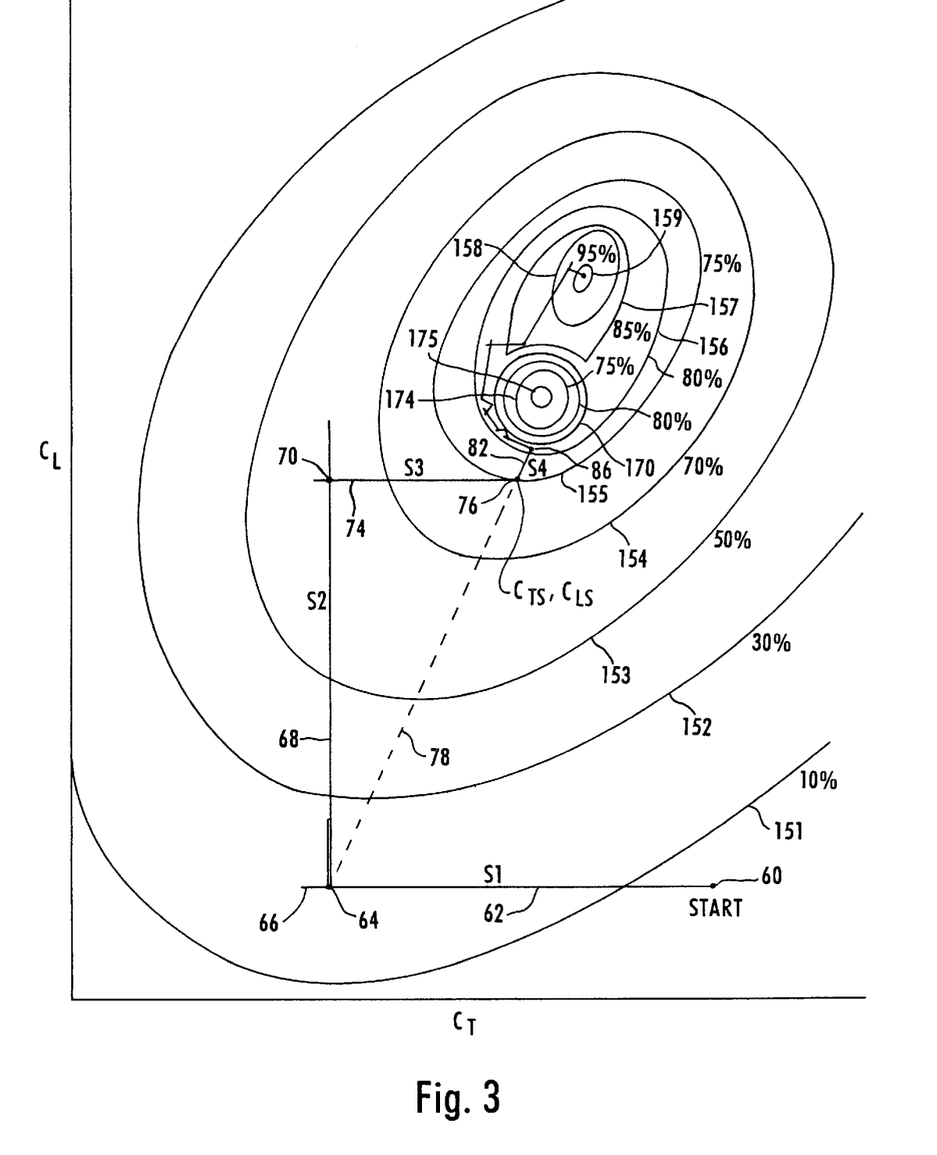

The present invention is concerned with how microprocessor 30 controls the values of capacitors 18 and 20 to avoid instability, while achieving maximum percentage delivered power, i.e. match. The technique microprocessor 30 employs to attain these results is described in connection with FIG. 3, which includes contours 151–159 which are similar to the contours of FIG. 2. Superimposed on percent delivered power contours 151–159 of FIG. 3 is somewhat circularly shaped exemplary unstable region 170. In region 170, the value of load capacitor 18 and tune capacitor 20 are such that the plasma in chamber 10 becomes unstable. The position of region 170 is not known but the region is generally avoided in accordance with various aspects of the present invention as microprocessor 30 controls the values of capacitors 18 and 20. Microprocessor 30 preferably varies the values of capacitors 18 and 20 simultaneously after unstable region 170 is encountered. The values of capacitors 18 and 20 are changed in such a manner that the match condition is reached, where percent delivered power is at least 96%.

In general, the plasma is more stable around the periphery of unstable region 170 than toward the center of the region. In the periphery of the unstable region the amount of amplitude modulation imposed on the r.f. frequency current flowing from source 14 to coil 12 and the variance of the RMS r.f. current are relatively low compared to the values of these parameters in the interior of the unstable region. The plasma is sufficiently stable at the periphery of region 170 to enable proper processing of workpieces in chamber 10. In contrast, in interior portions of unstable region 170 a substantial amount of amplitude modulation is imposed on the r.f. frequency current flowing from source 14 to coil 12 and the variance of the RMS r.f. current is quite high. The plasma is likely to be so unstable in portions of region 170 removed from the region periphery that workpieces in chamber 10 are improperly processed or possibly destroyed and the plasma is likely to become extinguished. Hence the periphery of region 170 can be considered as the onset of plasma instability that can lead to plasma instability that is so extensive that the workpiece in chamber 10 can be adversely affected.

In accordance with one embodiment, unstable plasma region 170 is preferably detected by microprocessor 30 monitoring a measure of the spread of values of an electric parameter resulting from r.f. current flowing from source 14 to coil 12; in one embodiment this parameter is detected percent delivered power. The spread of values is typically indicated by microprocessor 30 calculating the statistical quantity standard deviation or its square, i.e., variance, of the electric parameter. Alternatively, unstable region 170 is detected by monitoring the frequency and amplitude of amplitude modulation imposed on the r.f. current flowing from source 14 to coil 12, as indicated by current transducer 42. The plasma is considered unstable if there is appreciable amplitude modulation in the range of 2–20 kHz or in the range 50–200 kHz imposed on the r.f. current flowing from source 14 to coil 12.

Figure 4:
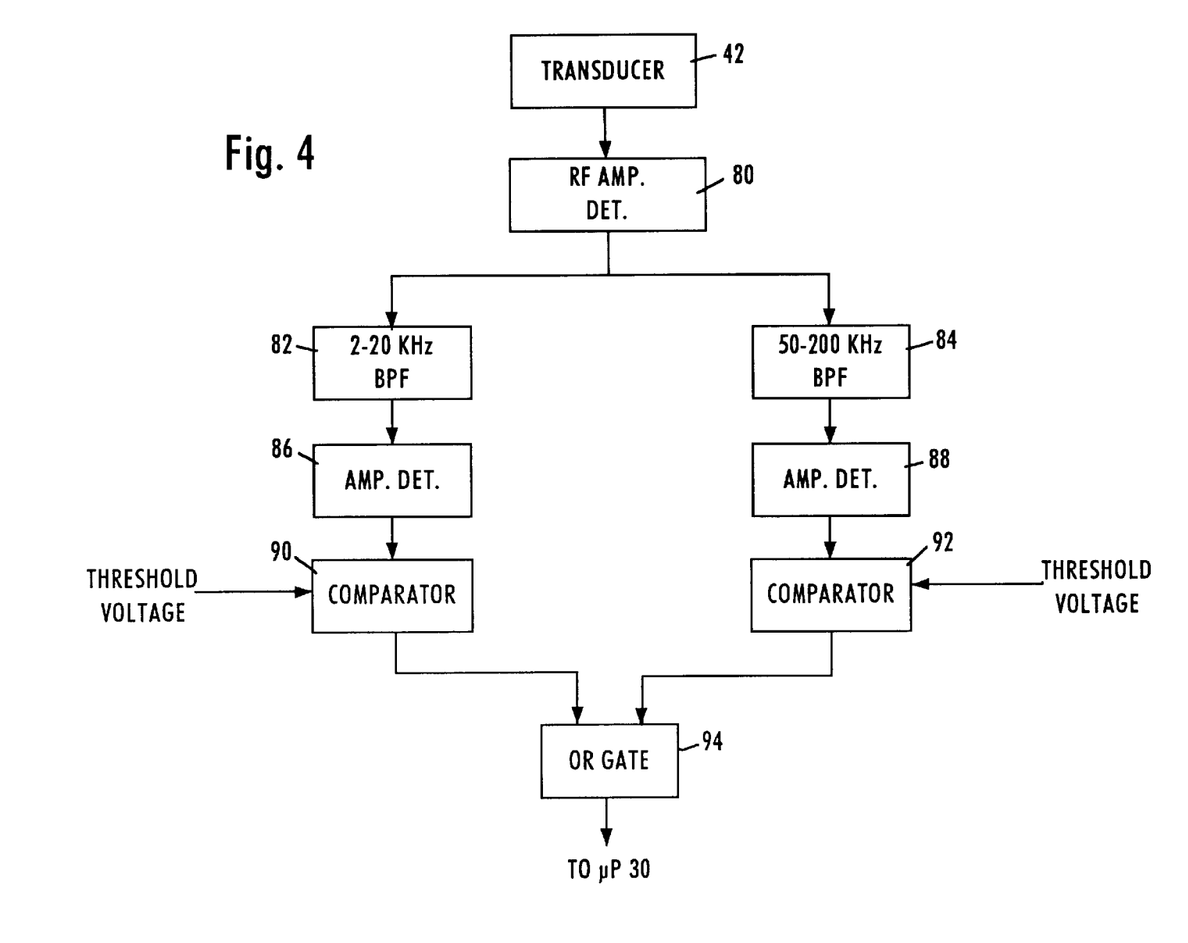
FIG. 4 is a circuit diagram of an alternate embodiment that can be used with FIG. 1 to detect the presence of plasma modulation.

Reference is now made to FIG. 4 of the drawing, a circuit diagram of an apparatus for supplying signals to microprocessor 30 to indicate the plasma of chamber 10 is being modulated. In essence, the circuit of FIG. 4 determines, from the current flowing to coil 12 as monitored by transducer 42, the amount of amplitude modulation imposed on the 13.56 MHz frequency of source 14 in either of the frequency bands 2–20 kHz or 50–200 kHz. In response to such modulation exceeding predetermined levels, the circuit of FIG. 4 supplies a signal to microprocessor 30 indicative of the modulation status of the plasma in chamber 10.

To enable these results to be determined, the r.f. output of transducer 42, a replica of the current flowing in coil 12 and therefore a replica of the conditions of the plasma flux in chamber 10, is supplied to r.f. amplitude detector 80 of a type similar to those employed in conventional AM radio receivers. Amplitude detector 80 derives an AC signal having amplitudes that are replicas of the degree of modulation in the 2–20 and 50–200 kHz bands. The output of detector 80 is supplied in parallel to bandpass filters 82 and 84, respectively having bandwidths of 2–20 kHz and 50–200 kHz. Bandpass filters 82 and 84 therefore derive output signals that are replicas of the modulation of the plasma in chamber 10 in the two frequency bands where modulation is known to occur. The output signals of bandpass filters 82 and 84 are respectively applied to amplitude detectors 86 and 88, which derive DC signals having amplitudes proportional to the RMS values of the AC outputs of the bandpass filters.

The output signals of amplitude detectors 86 and 88 are respectively applied to one input of amplitude comparators 90 and 92, each having a second input equal to a voltage directly proportional to a threshold value. The threshold values of comparators 90 and 92 are commensurate with the minimum RMS values in the 2–20 and 50–200 kHz bands which are associated with the plasma being unstable. Comparators 90 and 92 derive bi-level outputs, having high values only when the thresholds thereof are exceeded.

The outputs of comparators 90 and 92 are combined in OR gate 94 which thereby derives a high level when there is appreciable modulation power, in either the 2–20 kHz or 50–200 kHz bands, in the plasma in chamber 10. The bi-level, i.e., binary, output signal of OR gate 94 is supplied as one input to microprocessor 30. Alternatively, the two bi-level outputs of comparators 90 and 92 are supplied directly to microprocessor 30 which combines them to indicate the presence or absence of the modulation condition of the plasma in chamber 10.

When microprocessor 30 senses the modulation condition, an analog to digital converter therein responds to the outputs of amplitude detectors 86 and 88 and the microprocessor combines these two quantities to derive a signal that is a measure of the plasma instability. Microprocessor 30 can be programmed to calculate a similar measure of plasma instability from the standard deviation of percent delivered power when instability is first detected. It is to be understood that the hardware disclosed in connection with FIG. 4 can be replaced by suitable software in microprocessor 30 and EPROM 34, although the hardware implementation is less expensive and more easily provided.

EPROM 34 is programmed to control microprocessor 30 in accordance with one aspect of the present invention to enable maximum delivered power to be achieved, even though instability exists in the maximum delivered power trajectory between the starting point where tune capacitor 20 and load capacitor 18 have values of $C_{TS}$, $C_{LS}$, FIG. 3. Microprocessor 30 controls capacitors 18 and 20 so starting point $C_{TS}$, $C_{LS}$ is reached by using the techniques which have been generally outlined previously herein and are specified with greater particularity in the co-pending application.

EPROM 34 or a program in microprocessor 30 causes the microprocessor to calculate an initial maximum percent delivered power trajectory 82 in the manner described in the aforementioned co-pending application. Microprocessor 30 loads the slope of the calculated maximum percent delivered power trajectory 92 and the starting point $C_{TS}$, $C_{LS}$ into RAM 36. The microprocessor responds to these stored slope and starting point values to simultaneously change load capacitor 18 and tune capacitor 20. When microprocessor 30 senses that an unstable plasma region has been encountered, e.g., at point 86, in response to the variance of percent delivered power or in response to the output of OR gate 94, FIG. 4, the microprocessor determines a measure of plasma instability as discussed supra. If the standard deviation technique is employed, microprocessor 30 detects the plasma instability by calculating the square root of percent delivered power variance.

Microprocessor 30 responds to the program stored therein or in EPROM 34 to determine percent delivered power standard deviation at the point where instability is detected. The measure of plasma instability is a penalty factor (P), equal to the reciprocal of (1) standard deviation, or (2) the amplitude of the sum of the outputs of detectors 86 and 88, or (3) the amplitude of the greatest output of detectors 86 and 88. When the plasma is stable P=1. When the plasma is unstable whereby P is less than 1, the value of P is multiplied by an empirically determined constant K. Microprocessor 30 responds to the program stored in EPROM 34 to multiply the penalty factor (P) by an empirically determined constant (K), the value of percent delivered power at point $C_{T1}$, $C_{L1}$ (%$P_{delmax1}$) and derives a signal having a value equal to $$(P)(K)(\%P_{delmax1}) \qquad (1)$$

Figure 5:
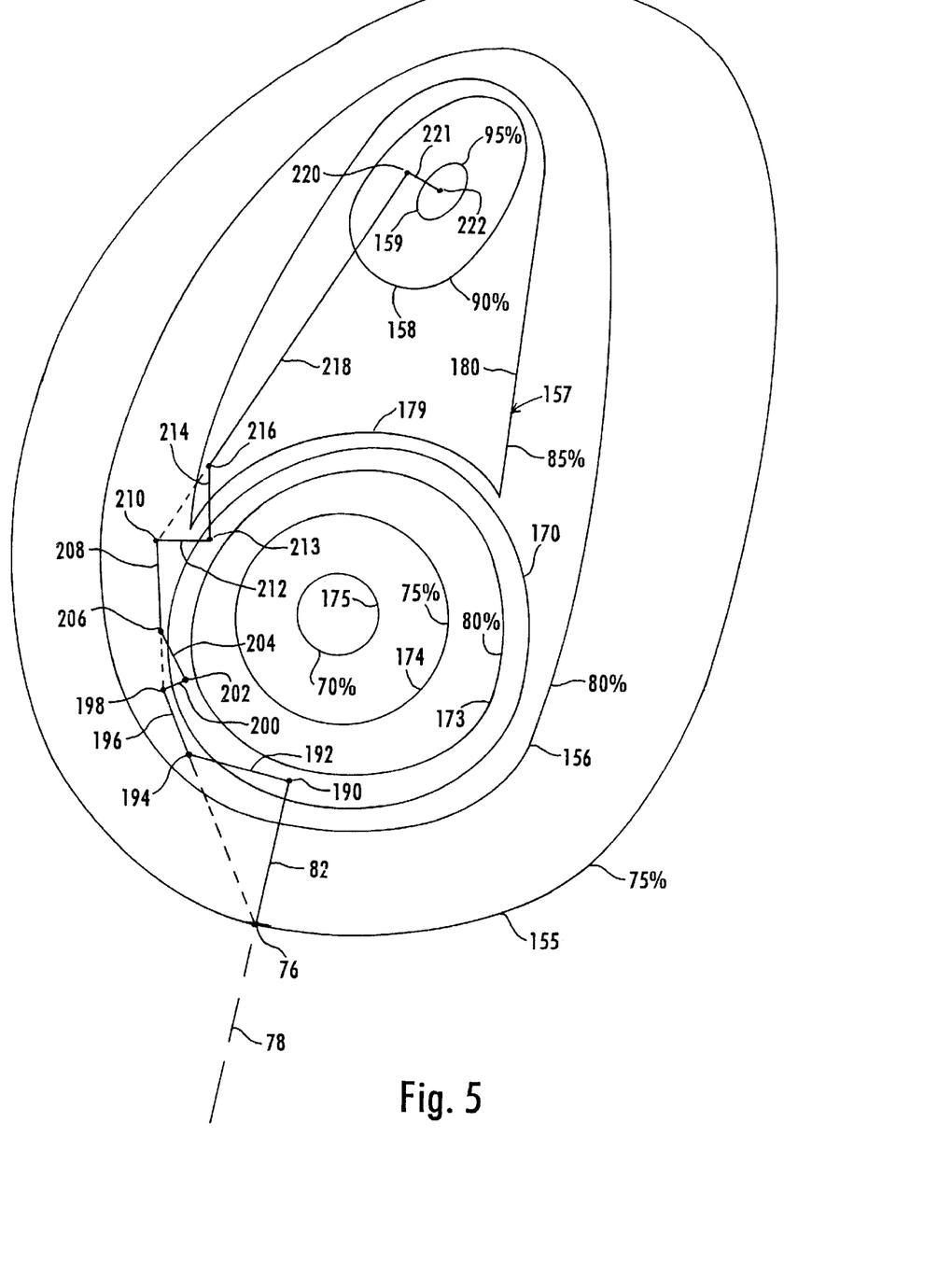
FIG. 5 is an enlargement of a portion of the plot illustrated in FIG. 3.

In accordance with FIGS. 3 and 5 (FIG. 5 is an enlargement of the portion of FIG. 3 inside 75% contour 155), the path is a series of straight line trajectories in the vicinity of the perimeter of unstable region 170. Microprocessor 30 calculates the percent delivered value in response to the average of several of the most recently detected data point values (e.g., from the five most recently detected data point values) and calculates the penalty factor from the average of several of the most recently detected values of amplitude modulation or from the standard deviation or variance of the data from several of the most recently detected values. Typically microprocessor 30 samples these values 20 times a second at the outputs of detectors 86 and 88 or from transducers 38 and 40.

Microprocessor 30 adds the amplitudes of the outputs of amplitude detectors 86 and 88 to derive a penalty indicating signal that is inversely proportional to the average value of the sum over the five most recent samples. Alternatively, microprocessor 30 compares the average amplitudes of the outputs of amplitude detectors 86 and 88 and derives a penalty indicating signal that is inversely proportional to the average output of the detector having the larger average amplitude. Microprocessor 30 calculates the values of standard deviation ($\sigma$) or variance ($\sigma^2$) based on the five most recent samples it obtains from transducers 38 and/or 40 in accordance with $$\sigma^2 = \frac{1}{5}\sum_{i=k}^{5}(x_i - \bar{x})^2 \qquad (2)$$

where $x_i$ is the value of the ith one of the five most recent samples k, k+1, k+2 ... k+5, and $\bar{x}$ is the average value of the five most recent samples. Measures of spread of values other than standard deviation or variance can also be used.

In executing the trajectories of FIGS. 3 and 5, microprocessor 30 controls capacitors 18 and 20 so the trajectory is approximately around the periphery of a portion of unstable region 170. Microprocessor 30 initially changes capacitors 18 and 20 so a first straight line trajectory is traced, as disclosed in the aforementioned patent. When microprocessor 30 detects the onset of instability it then changes the first trajectory direction 90°. Microprocessor 30 detects the onset of instability by sensing a decrease in the product of Equation (1), i.e. a reversal in the direction of change of the product. Hence microprocessor 30 essentially detects the onset of instability the same way it detects a local maximum of percent delivered power and then changes the time rate of change of capacitors 18 and 20 the same way it changes the time rate of change of the capacitors when a local maximum percent delivered power point is reached.

The product increases as trajectory 82 is traversed before unstable region 170 is encountered. As the unstable region is entered the values of P and the product decrease. Microprocessor 30 senses the reversal in the direction of the product, and loads into RAM 36 the values of $C_T$ and $C_L$ that are present when the product value changed direction. Transducers (not shown) on capacitors 18 and 20 supply signals $C_T$ and $C_L$ to microprocessor 30. Processor 30 then exchanges the time rate of change (slope) values of $$\frac{\Delta C_T}{\Delta T} \text{ and } \frac{\Delta C_L}{\Delta T}$$

for the trajectory 82, and reloads these changed slope values back into RAM 36 to establish the time rates of change of capacitors 18 and 20 along a new, second trajectory, at right angles to trajectory 82; the second trajectory begins where instability was detected in region 170. As the values of capacitors 18 and 20 change along the second trajectory in response to motors 26 and 28 responding to processor 30, the value of P then increases toward one because the second trajectory goes from an interior portion of region 170 toward the periphery of the unstable region.

EPROM 34 is programmed to control microprocessor 30 so the second trajectory is to the left of trajectory 82. If, however, microprocessor 30 senses a decrease of the product as the second trajectory is traversed, it reverses the direction of the second trajectory 180°. When microprocessor 30 detects the local maximum percent delivered power along the second trajectory, the microprocessor calculates a third trajectory as a straight line including the values of capacitors 18 and 20 at point 76 and the values of capacitors 18 and 20 at the local maximum percent delivered power point along the second trajectory. Microprocessor 30 then controls the values of capacitors 18 and 20 so the third trajectory is traversed. Microprocessor 30 then checks the direction of change of the product to assure that it is increasing and, if necessary, reverses the direction of the third trajectory. Microprocessor 30 then changes the time rates of change values of capacitors 18 and 20 until the microprocessor again detects a decrease in the product which can be due to plasma instability or a stable local maximum percent delivered power point.

Operation continues in this manner about the periphery of unstable region 170 until a further straight line trajectory is established that clears the unstable region. Microprocessor 30 controls capacitors 18 and 20 so the further trajectory is traversed until the microprocessor detects a local maximum percent delivered power point, i.e. an extreme value of local percent delivered power. Microprocessor 30 then controls the values of capacitor 18 and 20 as described in the aforementioned patent until the microprocessor detects a maximum percent delivered power in excess of a predetermined value, i.e., 96%. This technique is highly advantageous because of its simplicity, speed and minimum power requirements.

Referring now more particularly to FIGS. 3 and 5, somewhat circular unstable region 170 is located along maximum percent delivered power trajectory 82, between start point 76 and the maximum percent delivered power point along trajectory 82. Generally elliptical contour 156, representing 80% delivered power surrounds the periphery of unstable region 170. Within region 170 are generally circular contours 173, 174 and 175, respectively representing 80%, 75% and 70% delivered power, with each smaller percent contour being located further from the perimeter of region 170 and toward the interior of region 170; in other words, (penalized) percent delivered power decreases in region 170 as distance from the periphery of region 170 increases. Contours 173–175 represent theoretical values that would be calculated by the penalty X, i.e., average delivered power. However, in an actual, unstable situation, the contours are not as smooth as theoretical contours 173–175, whereby performance is somewhat different from the examples described infra. However, the examples provide a basis to understand how the system operates. Between the periphery of unstable region 170 and elliptical 90% delivered power contour 158 is 85% delivered power contour 157 including an arcuate concave line 179 (where contour 159 is close to and somewhat concentric with the periphery of region 170) and a somewhat elliptical locus 180 elsewhere. Microprocessor 30 controls the values of capacitors 18 and 20 so a series of straight line trajectories is traced close to a portion of the periphery of region 170. To this end, microprocessor 30 controls the values of capacitors 18 and 20 so point 76 is reached and trajectory 82 is traced, as described supra. While trajectory 82 is outside unstable region 170 there is no instability and microprocessor 30 computes the penalty factor as P=1.0. When trajectory 82 is inside unstable region 170, at point 190, microprocessor 30 reduces the amplitude of penalty factor P, as described supra. Microprocessor 30 responds to the resulting reduced product of Equation (1) to change the direction of change of capacitors 18 and 20 by 90° and calculate trajectory 192. Microprocessor 30 then controls capacitors 18 and 20 so trajectory 192 is traversed from the interior of region 170 toward and through the periphery of region 170. Microprocessor 30 stores a flag that a left turn was made in traversing the path from trajectory 82 to trajectory 192.

Microprocessor 30 stops varying capacitors 18 and 20 along trajectory 192 when the microprocessor detects local maximum percent delivered power point 194. Microprocessor 30 then computes a new straight line trajectory 196, defined by the line beginning at point 76 and extending through point 194.

Microprocessor 30 then controls the values of capacitors 18 and 20 so trajectory 196 is traced from point 194 until the microprocessor detects local maximum percent delivered power point 198. When microprocessor 30 detects that point 198 has been reached, it calculates trajectory 200, that extends through point 198 and is at right angles to trajectory 196. Microprocessor 30 responds to the stored flag indicative of a left turn from trajectory 82 to trajectory 192 and commands capacitors 18 and 30 to vary so trajectory 200 makes a right turn relative to trajectory 196.

Microprocessor 30 then responds to the product of percent delivered power and penalty factor (having a value of one) as trajectory 200 is traversed to check that the product is increasing. Microprocessor 30 causes trajectory 200 to be traversed until it detects a decreased product at point 202 in unstable region 170. Because point 202 is in unstable region 170, microprocessor 30 calculates a new trajectory 204 having a 90° angle to trajectory 200 and including point 202. Trajectory 204 is to the left of trajectory 200 since the turn flag in RAM 36 signals a right turn from trajectory 196 to trajectory 200. Microprocessor 30 then controls motors 18 and 20 so trajectory 200 is initially traversed. Then microprocessor 30, after checking the value of the product to determine it is increasing, causes trajectory 204 to be traversed until the microprocessor senses maximum percent delivered power point 206. Microprocessor 30 then calculates trajectory 208 from the values of capacitors 18 and 20 at points 198 and 206. Then microprocessor 30 causes the values of capacitors 18 and 20 to vary so trajectory 208 is traversed until the product has a maximum value at point 210.

Microprocessor 30 continues to operate in this manner so trajectory 212 is traversed, point 213 in unstable region 170 is reached and then trajectory 214 is traversed. Trajectory 214 is traversed until unstable region 170 has been cleared at point 216.

At maximum reflected power point 216, microprocessor 30 computes trajectory 218 based on the slope of the line between points 210 and 216. Microprocessor 30 then controls the values of capacitors 18 and 20 so straight line trajectory 218 is executed. Trajectory 218 continues until maximum power point 220 is reached. At maximum power point 220, microprocessor 30 reverses the time rate of change of values for capacitors 18 and 20, to compute trajectory 221. Trajectory 221 is to the right of trajectory 218 because trajectory 214 was to the left of trajectory 212. After microprocessor 30 computes trajectory 221, the microprocessor begins to change the values of capacitors 18 and 20 along trajectory 221. Since the value of percent delivered power increases as trajectory 221 is traversed, microprocessor 30 continues to cause the values of capacitors 18 and 20 to continue to change in this direction. If, however, the values of percent delivered power decreased as trajectory 221 was being traversed, microprocessor 30 would have reversed the direction of change of trajectory 221 by 180°. Trajectory 221 is traversed until maximum power point 222 is reached. Since maximum power point 222 is at a maximum percent delivered power greater than 96%, microprocessor 30 stops varying the values of capacitors 18 and 20. Hence, the maximum power point has been reached, without encountering a significant part of instability region 170.

Figure 6:
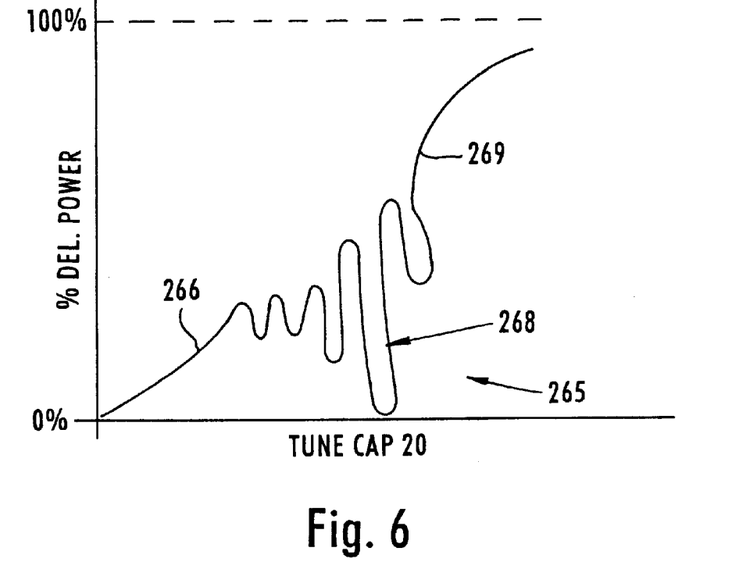
FIG. 6 is a plot of percent delivered power vs. the value of one of the matching network variable capacitors of FIG. 1.

To provide further insight about the present invention, consider FIG. 6 wherein trace 265 indicates percent delivered power vs. the value of tune capacitor 20, based on the assumption that unstable region 170 was traversed by a single straight line path from point 64 to point 222 and including trajectory 82. FIG. 6 assumes the unstable region 170 illustrated in FIGS. 3 and 5. Trace 265 includes smooth portions 266 and 269 having a very low standard deviation associated with stability, between which is jagged region 268, having a high standard deviation associated with instability. For values of capacitor 20 between points 64 and unstable region 170, trace 265 smoothly increases along gradually curved segment 266 from a very low percent delivered power value as the value of tune capacitor 20 increases. As the value of capacitor 20 continues to increase, the smooth portion 266 of trace 265 turns into jagged variations 268 of percent delivered power. Jagged variations 268 may have such a large amplitude as to result in plasma extinction. Jagged variations 268 indicate the r.f. plasma in chamber 10 is unstable and has modulation imposed on it. Jagged segment 268 has a much higher standard deviation than smooth curved portion 266.

Figure 7:
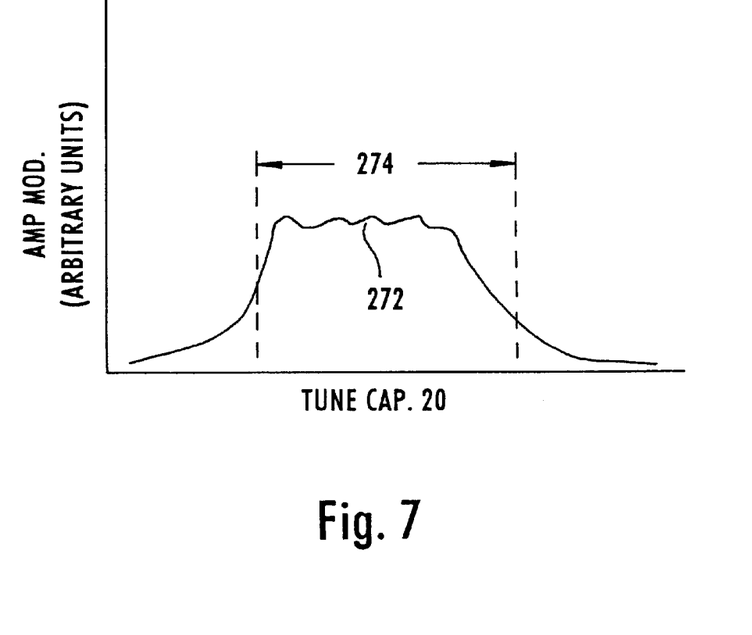
FIG. 7 is a plot of the degree of amplitude modulation of the plasma of FIG. 1 versus the value of one of the matching network variable capacitors.

FIG. 7 includes trace 272 representing total amplitude modulation that would be imposed on the r.f. plasma, as indicated by the r.f. current detected by current transducer 42, if the value of tune capacitor 20 were to be varied so a straight line path including trajectory 82 were traversed from point 64 to point 222. Trace 272 has low values for low values of tune capacitor 20 between point 64 and one side of unstable region 170 and for high values of capacitor 20 between the other side of region 170 and point 222. However, in region 274 where the plasma is unstable the total amplitude modulation is quite high.

Microprocessor 30 senses the onset of jagged region 268 or region 274 by detecting the measure of the spread of values of percent delivered power or by sensing the amplitude modulation of the r.f. current flowing to coil 12 and/or by sensing a decrease in the product of Equation (1). In accordance with the present invention, unstable region 170 and consequently jagged region 268 and high amplitude modulation region 274 are detected and then avoided by varying the values of capacitors 18 and 20 as described supra.

While there have been described and illustrated several specific embodiments of the invention, it will be clear that variations in the details of the embodiments specifically illustrated and described may be made without departing from the true spirit and scope of the invention as defined in the appended claims. For example, percent delivered power is only one of several ways of determining when the best local or ultimate impedance match is established between source 14 and coil 12.

What is claimed:

1. A method of detecting an unstable condition of a plasma of a plasma processor processing a particular workpiece, the plasma being derived by a reactive impedance element supplying an energizing r.f. field to a gas in the processor, the method comprising signalling that a function determined by the spread values of an electrical parameter resulting from the supplied field processing the particular workpiece exceeds an amplitude associated with the unstable condition.

2. The method of claim 1 wherein the function is variance.

3. A method of detecting an unstable condition of a plasma of a plasma processor processing a particular workpiece, the plasma being derived by a reactive impedance element supplying an energizing r.f. field to a gas in the processor, the method comprising detecting the amplitude of an electrical parameter resulting from the field being supplied to the reactive impedance element for the particular workpiece that is being processed, detecting the value of a function indicating the spread of values of the electrical parameter for the particular workpiece that is being processed, and indicating that the detected value of the function exceeds an amplitude associated with the unstable condition.

4. A method of detecting an unstable condition of a plasma of a plasma processor, the plasma being derived by a reactive impedance element supplying an energizing r.f. field to a gas in the processor, the method comprising detecting the amplitude of an electrical parameter resulting from r.f. current being supplied to the reactive impedance, the electrical parameter having a carrier frequency determined by the r.f. frequency of the field, the carrier being amplitude modulated at at least one frequency as a result of the unstable condition, and detecting the presence of the amplitude modulation at said one frequency.

5. The method of claim 4 wherein said frequency is in the 2–20 KHz range.

6. The method of claim 4 wherein said frequency is in the 50–200 KHz range.

7. The method of claim 4 wherein the carrier is amplitude modulated at plural frequencies in different ranges, and detecting the amplitude modulation at the plural frequencies.

8. The method of claim 4 wherein the plasma is processing a particular workpiece, the amplitude being detected in response to the r.f. current that flows while the particular workpiece is being processed.

9. Apparatus for detecting an unstable condition of a plasma of a plasma processor, the unstable condition being such that it can adversely affect processing of a workpiece by the processor, the plasma being derived by a reactive impedance element supplying an energizing r.f. field to a gas in the processor, the apparatus comprising a detector of an electrical parameter resulting from the supplied field being applied to the reactive impedance element, and a processor responsive to the detected electrical parameter for a function determined by the spread values of the detected electrical parameter exceeding an amplitude associated with the unstable condition.

10. The apparatus of claim 9 wherein the function is variance.

11. An apparatus for detecting an unstable condition of a plasma of a plasma processor, the unstable condition being such that it can adversely affect processing of a workpiece by the processor, the plasma being derived by a reactive impedance element for supplying an energizing r.f. field to a gas in the processor, the apparatus comprising a detector of the amplitude of a function of an electrical parameter resulting from r.f. current being supplied to the reactive impedance, the electrical parameter having a carrier frequency determined by the r.f. frequency of the field, the carrier being amplitude modulated by at least one frequency as a result of the unstable condition, and a detector arranged to detect the presence of the amplitude modulation at said one frequency.

12. The apparatus of claim 11 wherein said frequency is in the 2–20 kHz range.

13. The apparatus of claim 11 wherein said frequency is in the 50–200 kHz range.

14. The apparatus of claim 11 wherein the carrier is amplitude modulated at plural frequencies in different ranges, and the detector is arranged to detect the amplitude modulation at the plural frequencies.

15. The method of claim 11 wherein the apparatus is for detecting the unstable condition of the plasma that occurs while the plasma is processing a particular workpiece, the detector being responsive to the amplitude of the r.f. current that flows while the particular workpiece is being processed by the plasma.

16. A method of detecting an unstable condition of a plasma of a plasma processor processing a particular workpiece, the plasma being derived by a reactive impedance element supplying an energizing r.f. field to a gas in the processor, the method comprising detecting the amplitude of an electrical parameter resulting from r.f. current flowing between an r.f. source and the reactive impedance for the plasma that is processing the particular workpiece, and signalling the unstable condition of the plasma that is processing the particular workpiece in response to the electrical parameter having a predetermined characteristic.

17. The method of claim 16 wherein the predetermined characteristic is the presence of amplitude modulation in at least one frequency range on the r.f. current flowing between the r.f. source and the reactive impedance element.

18. The method of claim 17 wherein the r.f. current flows between the reactive impedance element and the r.f. source via a matching network.

19. The method of claim 16 wherein the predetermined characteristic is indicative of a measure of the spread of values of the r.f. current exceeding a predetermined value.

20. The method of claim 19 wherein the r.f. current flows between the reactive impedance element and the r.f. source via a matching network.

21. Apparatus for detecting an unstable condition of a plasma for processing a particular workpiece in a plasma processor, the plasma being derived by a reactive impedance element for supplying an energizing r.f. field to a gas in the processor, the apparatus comprising a detector for the amplitude of a function of an electrical parameter resulting from r.f. current flowing between an r.f. source and the reactive impedance for the plasma that is processing the particular workpiece, and a signal processor connected to be responsive to the detector for deriving a signal indicating that the plasma processing the particular workpiece is in the unstable condition in response to the electrical parameter having a predetermined characteristic.

22. The apparatus of claim 21 wherein the predetermined characteristic is the presence of amplitude modulation in at least one frequency range on the r.f. current flowing between the r.f. source and the reactive impedance element.

23. The apparatus of claim 22 further including a matching network connected between the r.f. current source and the reactive impedance element, the detector being responsive to r.f. current flowing between the source and the reactive impedance element via the matching network.

24. The apparatus of claim 21 wherein the predetermined characteristic is indicative of a measure of the spread of values of the r.f. current exceeding a predetermined value.

25. The apparatus of claim 24 further including a matching network connected between the r.f. current source and the reactive impedance element, the detector being responsive to r.f. current flowing between the source and the reactive impedance element via the matching network.

* * * * *